(12) United States Patent
Johnson

(10) Patent No.: US 7,786,745 B2
(45) Date of Patent: Aug. 31, 2010

(54) METHOD AND APPARATUS FOR SINGLE-SIDED EXTENSION OF ELECTRICAL CONDUCTORS BEYOND THE EDGES OF A SUBSTRATE

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 113 days.

(21) Appl. No.: 12/347,995

(22) Filed: Dec. 31, 2008

(65) Prior Publication Data

US 2010/0001750 A1     Jan. 7, 2010

Related U.S. Application Data

(62) Division of application No. 11/881,574, filed on Jul. 27, 2007, now Pat. No. 7,489,148.

(60) Provisional application No. 60/834,063, filed on Jul. 28, 2006.

(51) Int. Cl.
*G01R 31/02* (2006.01)

(52) U.S. Cl. .................................... 324/754; 324/758
(58) Field of Classification Search .................. None
See application file for complete search history.

(56) References Cited

U.S. PATENT DOCUMENTS

| 5,453,701 A * | 9/1995 | Jensen et al. ............... 324/755 |
| 6,433,563 B1 * | 8/2002 | Maruyama ................. 324/754 |
| 6,842,030 B2 * | 1/2005 | Kim et al. ................... 324/765 |

* cited by examiner

*Primary Examiner*—Paresh Patel
(74) *Attorney, Agent, or Firm*—Raymond J. Werner

(57) ABSTRACT

An apparatus for providing electrical pathways between one or more unsingulated integrated circuits and one or more test circuits external to the integrated circuits, includes a flexible substrate having a first major surface and a second major surface, a plurality of first contact structures disposed in a central portion of the first surface of the flexible substrate, a plurality of second contact structures disposed in a peripheral annular region of the first surface of the flexible substrate, and a plurality of first electrically conductive pathways, each of the plurality of first electrically conductive pathways coupled to a respective first and second contact structure, wherein the second surface is free from first contact structures, second contact structures, and first electrically conductive pathways.

10 Claims, 7 Drawing Sheets

METHOD AND APPARATUS FOR SINGLE-SIDED EXTENSION OF ELECTRICAL CONDUCTORS BEYOND THE EDGES OF A SUBSTRATE

CROSS-REFERENCE TO RELATED APPLICATIONS

This is a divisional application of non-provisional application Ser. No. 11/881,574, filed 27 Jul. 2007, now U.S. Pat. No. 7,489,148 entitled "Methods For Access To Plurality Of Unsingulated Integrated Circuits Of A Wafer Using Single-Sided Edge-Extended Wafer Translator", which claimed the benefit of Provisional Application 60/834,063, filed 28 Jul. 2006, and entitled "Methods And Apparatus For Single-Sided Extension Of Electrical Conductors Beyond The Edges Of A Substrate", the entirety of each of which are hereby incorporated by reference.

FIELD OF THE INVENTION

The present invention relates generally to semiconductor test equipment, and more particularly relates to methods and apparatus for routing electrical conductors to and from integrated circuits, microelectromechanical devices (MEMs), or similar structures in a test environment.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

The maintenance of probe tip accuracy, good signal integrity, and overall dimensional accuracy severely strains even the best of these highly developed fabrication methods because of the multiple component and assembly error budget entries.

What is needed are lower-cost, less-complex apparatus and methods to increase test efficiency.

SUMMARY OF THE INVENTION

Briefly, an apparatus for providing electrical pathways between one or more unsingulated integrated circuits and one or more test circuits external to the integrated circuits, includes a flexible substrate having a first major surface and a second major surface, a plurality of first contact structures disposed in a central portion of the first surface of the flexible substrate, a plurality of second contact structures disposed in a peripheral annular region of the first surface of the flexible substrate, and a plurality of first electrically conductive pathways, each of the plurality of first electrically conductive pathways coupled to a respective first and second contact structure, wherein the second surface is free from first contact structures, second contact structures, and first electrically conductive pathways.

DETAILED DESCRIPTION

Figure 1:
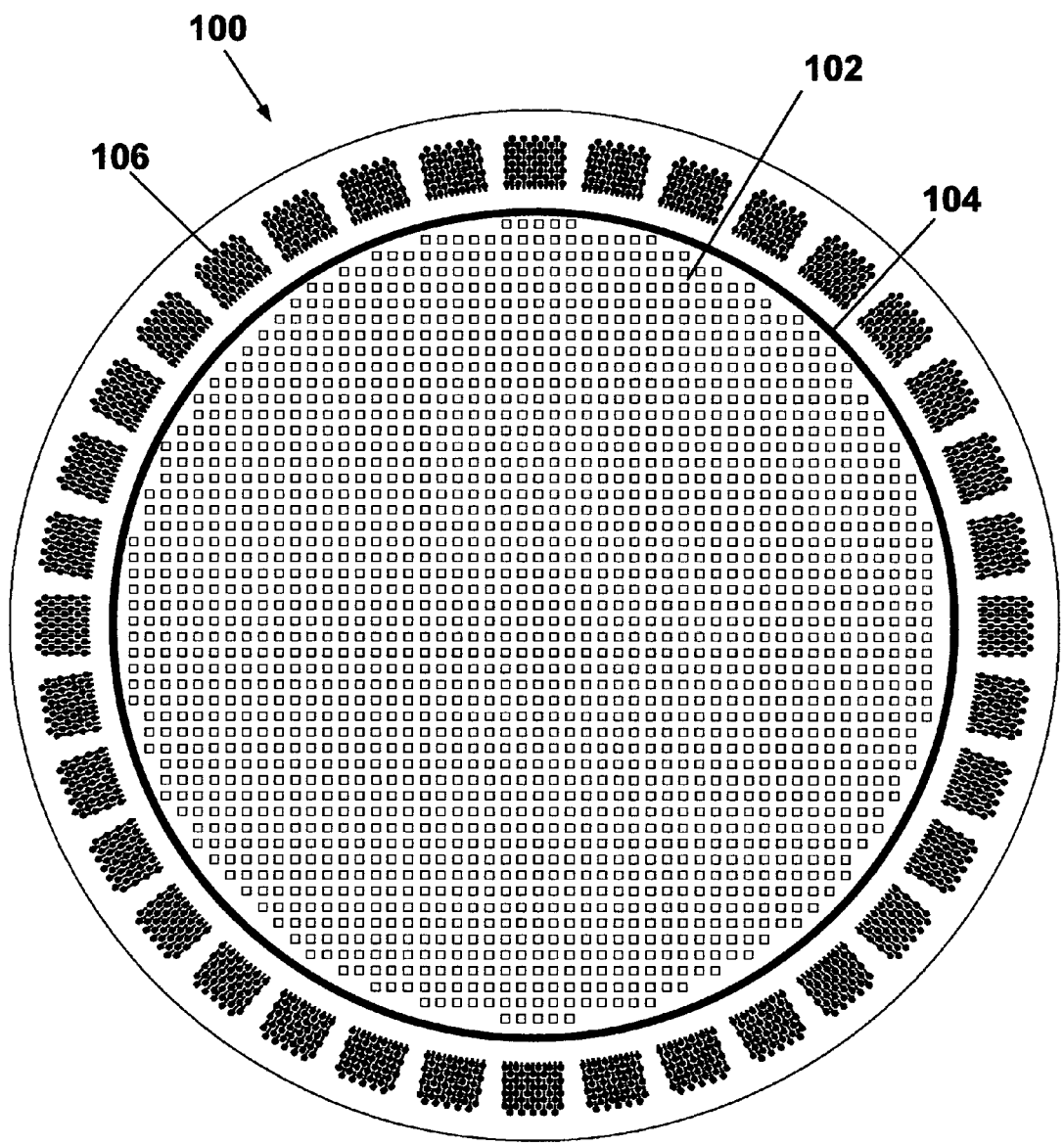
FIG. 1 illustrates the wafer-side of a single-sided edge-extended wafer translator in accordance with the present invention.

Generally, one or more conductive paths, for signals and/or power, are provided by a substrate having a first set of contact terminals disposed in a central portion of a first surface thereof and a second set of contact terminals disposed in an annular region located adjacent to the outer edges of the first surface. In some embodiments of the present invention the substrate is flexible. In some embodiments of the present invention there are one or more evacuation pathways through the substrate, Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge-extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge-extended translator.

The expression "translated wafer" refers to a wafer/wafer translator pair in the attached state. In other words, a wafer and a wafer translator attached to each other, wherein a predetermined portion of, or all of, the contact pads of the integrated circuits on the wafer are in electrical contact with corresponding electrical connection means disposed on the wafer-side of the translator. Typically, the wafer translator is removably attached to the wafer. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

FIG. 1 shows the wafer-side of a single-sided edge-extended wafer translator 100, showing a plurality of electrically conductive contact pad arrays 102 disposed within an area bounded by a gasket placement region 104 of single-sided edge-extended translator 100, the area corresponding in diameter to that of a wafer to be tested. Electrically conductive test pad arrays 106 are disposed within an annular region between the outer edge of gasket placement region 104 and the outer edge of translator 100. It is noted that contact pad arrays 102 and test pad arrays 106 are disposed on the same side of single-sided edge-extended wafer translator 100.

Still referring to FIG. 1, it is noted that gasket placement region 104 may be a portion of the surface of the wafer translator upon which a gasket may be placed, or it may be a metal ring upon which a gasket may be placed. An arrangement in which a metal ring is disposed in gasket placement region 104 may improve the adhesion of the gasket to the surface of the translator. In an alternative arrangement, a pair of concentric metal rings may be formed in gasket placement region 104. In this case, the pair of concentric rings essentially forms a groove, or trench, between them, and this groove is suitable for receiving a gasket.

Figure 2:
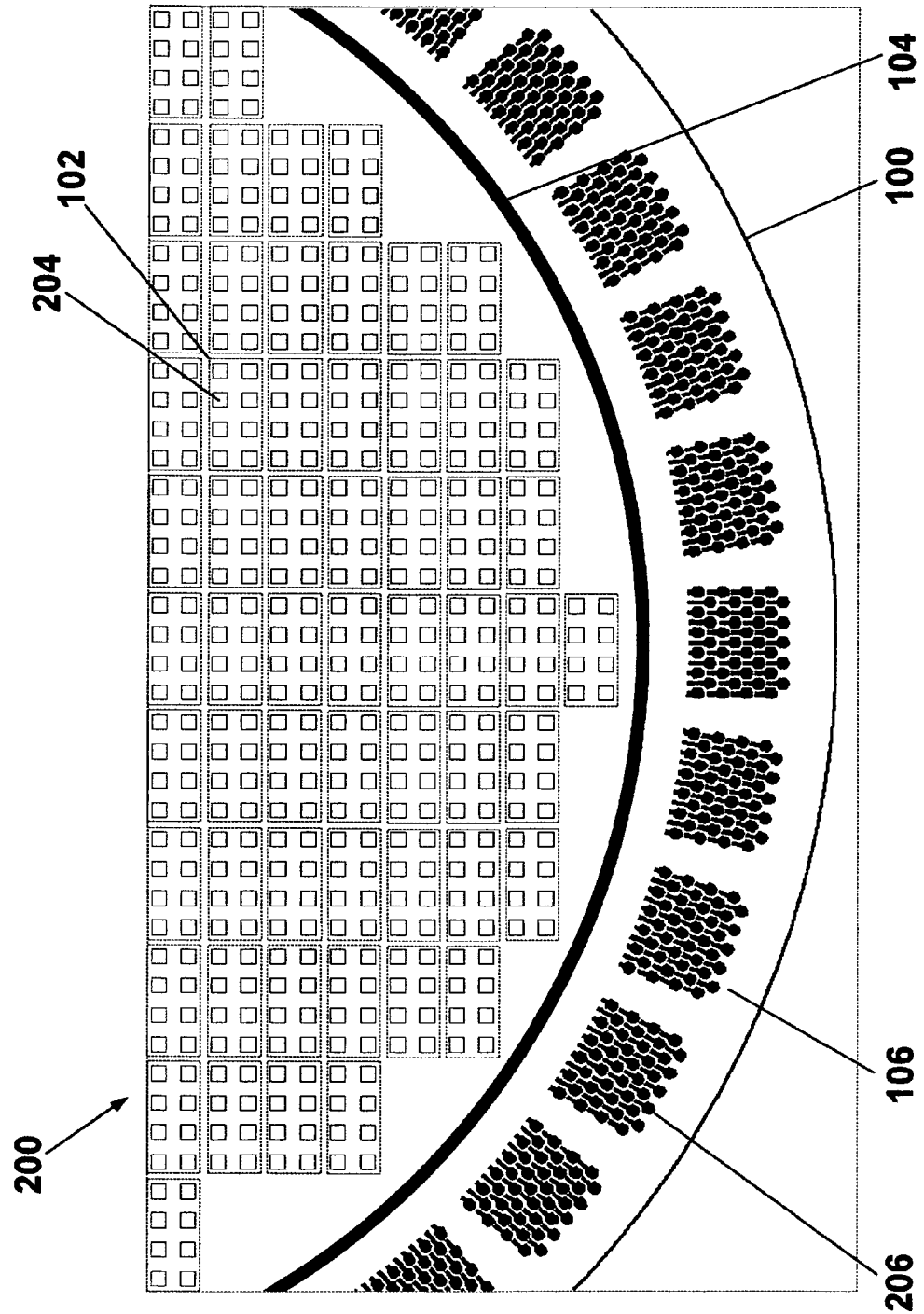
FIG. 2 is a close-up, wafer-side view of a section of a single-sided edge-extended wafer translator in accordance with the present invention.

FIG. 2 is a close-up schematic top-view representation 200 of a section of single-sided translator 100, in which it can be seen that each wafer contact pad array 102 includes a plurality of wafer contact pads 204. Each test pad array includes a plurality of test pads 206. It is noted that wafer contact pads 204, which are disposed within wafer contact pad arrays 102, may be fabricated at a first scale corresponding to, and suitable for contacting, the pads found on a wafer or other device under test, while test pads 206, which are disposed within test pad arrays 106, may be fabricated at a second scale suitable for contact by test pin arrays, test probes, or other external devices.

Still referring to FIG. 2, it is noted that wafer contact pads 204 may be formed as substantially planar pads upon which electrically conductive contact structures, such as stud bumps, are disposed. In this case, when the wafer and wafer translator are in the attached state, the contact structures physically touch the pads of the wafer. In alternative arrangements, wafer contact pads 204 may be photolithographically defined structures.

Figure 3:
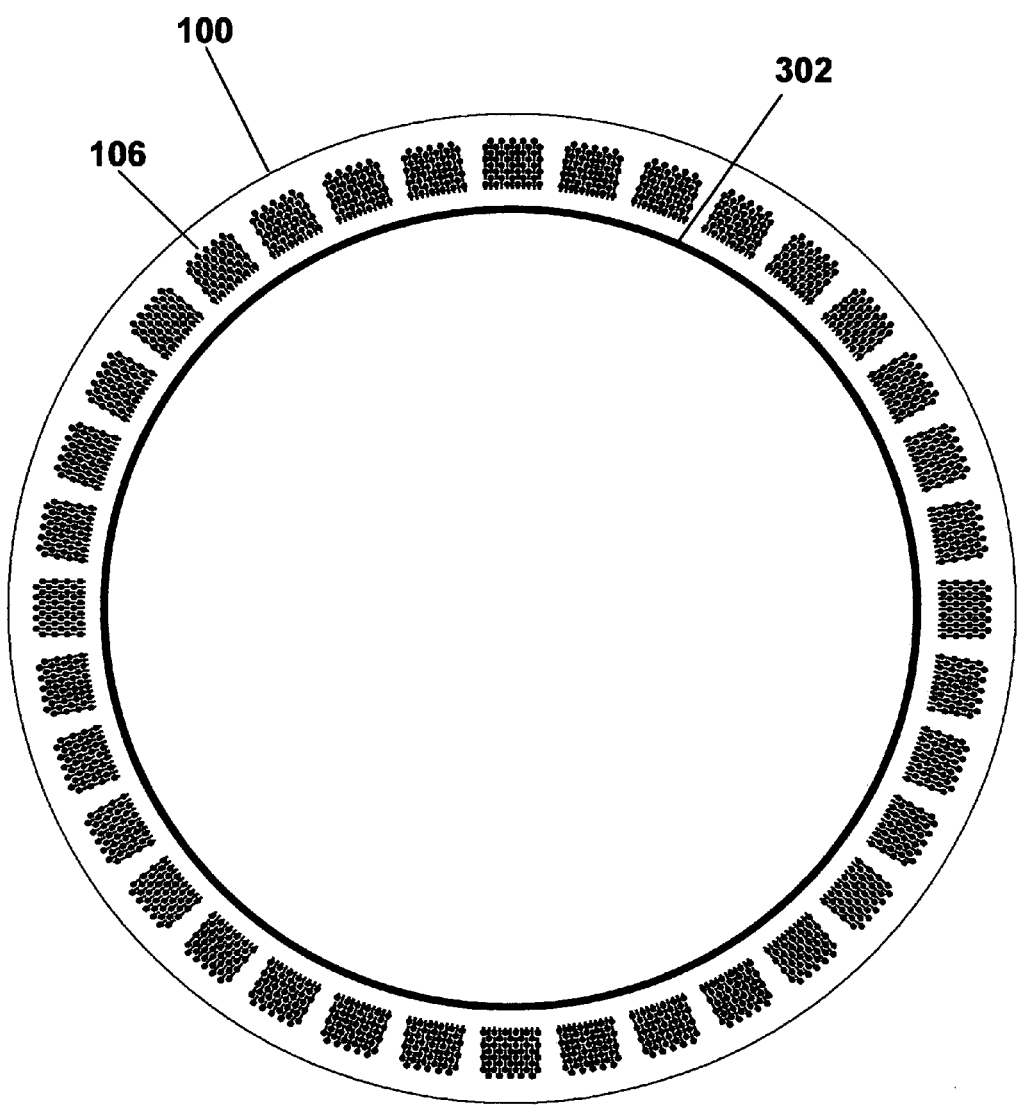
FIG. 3 is a wafer-side view of a single-sided edge-extended translator in alignment with a wafer.

FIG. 3 is a schematic top-view representation of single-sided translator 100 in alignment with a wafer 302. It is appreciated that test pad arrays 106 remain available for contact by test equipment even after the wafer and translator are attached to each other.

Figure 4:
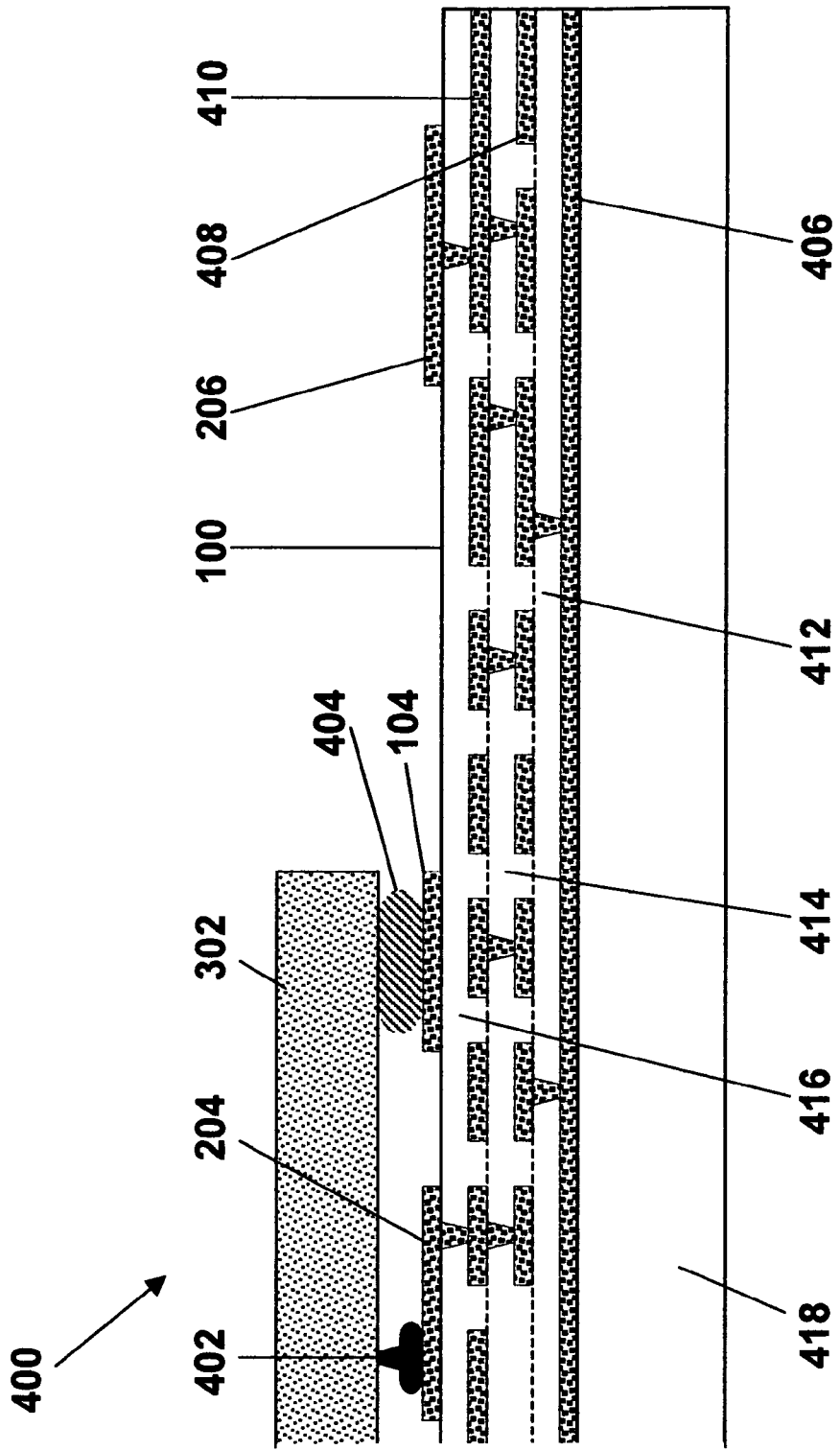
FIG. 4 is a schematic cross-sectional view of a portion of a single-sided edge-extended translator and wafer in the attached state in accordance with the present invention.

FIG. 4 is a close-up, schematic cross-sectional view of a section of a single-sided translator and wafer assembly 400 in accordance with the present invention. A continuous metal ground plane 406 may be disposed on an organic or inorganic substrate 418. A patterned layer of dielectric material 412 may be disposed upon ground plane 406. Subsequent patterned layers of metal 408, 410 may be formed, alternating with patterned layers of dielectric material 412, 414, 416 so as to form continuous wire pathways which may electrically connect wafer contact pads 204 and wafer test pads 206. Pads 204, pads 206, and gasket pad 104 are formed by depositing and patterning a conductive layer on dielectric layer 416. It is appreciated that alternative embodiments in which fewer or more layers of metal and dielectric materials are envisioned in accordance with the present invention. A wafer 302 may be mounted on translator 100 by means of a gasket 404 affixed to gasket pad 104. Metal stud bumps 402 disposed on pads 204 may contact pads disposed on the translator side of wafer 302.

Figure 5:
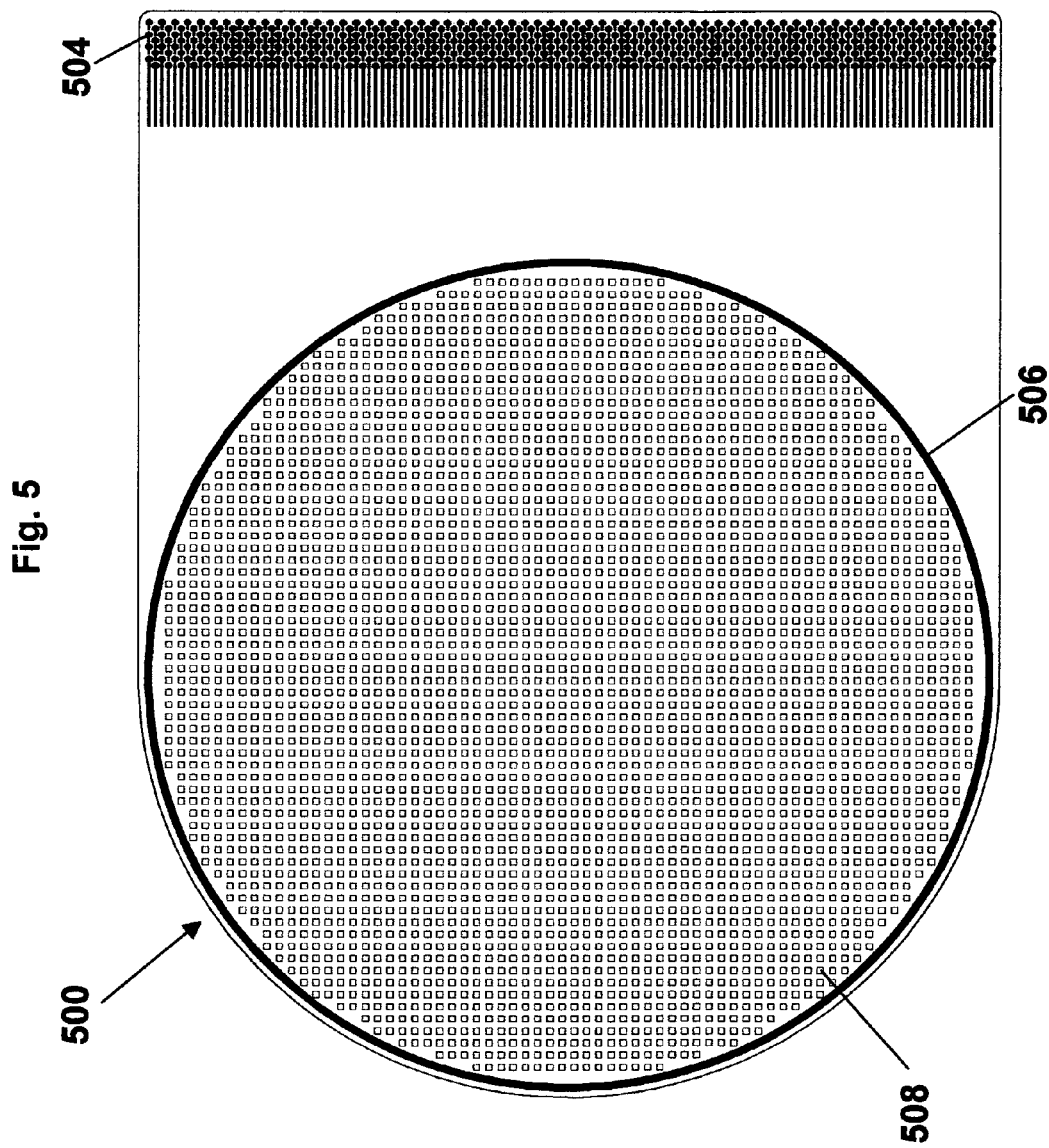
FIG. 5 is a wafer-side view of a single-sided edge-extended translator with a non-circular form factor in accordance with the present invention.

FIG. 5 is a top-view, schematic representation of an embodiment of a single-sided translator with a non-circular form factor 500, in which test pads 504 are disposed on one side of translator 500, while wafer contact pad arrays 508 are disposed within the circumferential margin defined by gasket pad 506. It is appreciated that a printed translator may take any shape so long as it includes a planar surface that extends beyond the circumferential edge of a wafer or device under test.

A single-sided edge-extended translator, as pictured in FIGS. 1-5, provides the electrical interface between the wafer and a test system (not shown). Such a test system may provide power and signals to the device under test, and may further receive signals from the device under test.

Apparatus in accordance with the present invention are suitable for providing electrical connections between a first set of pads on at least one die of a wafer and a corresponding second set of pads disposed on an insulating body removably attached to that wafer. More particularly, the insulating body has a form factor such that, when attached to the wafer, a portion of the insulating body extends beyond the area defined by the wafer. The second set of pads may be disposed on portions of the wafer-side of the insulating body that are not covered by the attached wafer in alternative configurations beyond those described in the embodiments shown in FIGS. 1-5, including, but not limited to, D-shaped configurations, square configurations, and rectangular configurations.

Figure 6:
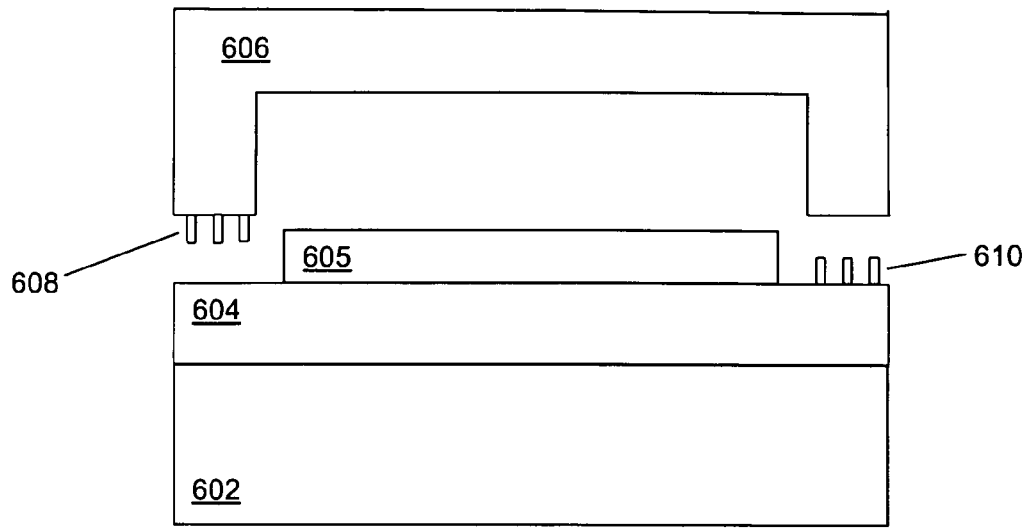
FIG. 6 is a cross-sectional view of a wafer/wafer translator pair in the attached state, where the wafer translator is a single-sided edge-extended wafer translator, the single-sided edge-extended wafer translator is disposed on a support structure, and an inquiry system interface is disposed so as to move one or more terminals into electrical contact with the test pads of the single-sided edge-extended wafer translator.

FIG. 6 shows an illustrative embodiment of the present invention in which a wafer/wafer translator pair in the attached state is disposed on a support structure where the wafer translator is a single-sided edge-extended wafer translator. More particularly, a support structure 602 is provided, and a single-sided edge-extended wafer translator 604 and a wafer 605 in the attached state are disposed on support structure 602 such that the non-wafer side of wafer translator 604 is upon support structure 602. An inquiry system interface 606 is provided that is adapted to make electrical contact with the test pad arrays, which are disposed in an annular region located near the periphery of the wafer-side of wafer translator 604 that is not covered by the attached wafer. In some embodiments, support structure 602 remains stationary while inquiry system interface 606 moves into engagement with the test pad arrays of wafer translator 604. In other embodiments, inquiry system interface 606 remains stationary while support structure 602 moves toward inquiry system interface 606 thereby carrying wafer translator 604 into engagement with inquiry system interface 606. In a first contact arrangement, illustrated at 608, contact structures extend from inquiry system interface 606 towards the test pad arrays of single-sided edge-extended wafer translator 604. In an alternative contact arrangement, illustrated at 610, contact structures extend from wafer translator 604 towards inquiry system interface 606. It is noted that any suitable contact structures may be used, and the present invention is not limited to pins, pogo pins, micro-springs, contact pads, stud bumps, or similar structures. In some embodiments, pins are brazed onto corresponding pads of the test pad arrays and the inquiry system interface provides a socket that engages with those pins. Such a socket may be a zero insertion force (ZIF) type of socket.

Figure 7:
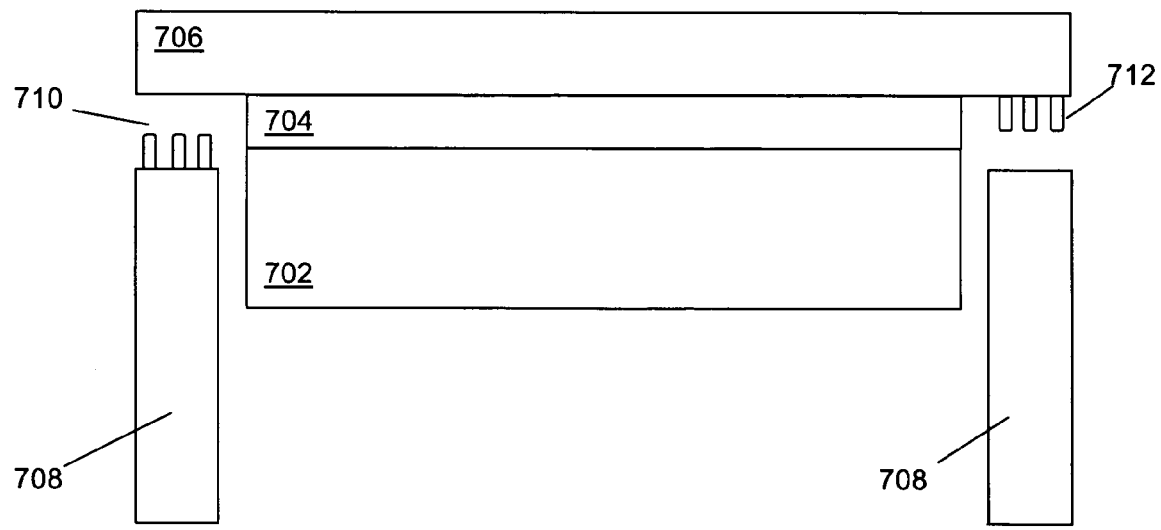
FIG. 7 is a cross-sectional view of a wafer/wafer translator pair in the attached state, where the wafer translator is a single-sided edge-extended wafer translator, the wafer is disposed on a support structure, and an inquiry system interface is disposed so as to move one or more terminals into electrical contact with the test pads of the single-sided edge-extended wafer translator.

FIG. 7 shows an illustrative embodiment of the present invention in which a wafer/wafer translator pair in the attached state is disposed on a support structure where the wafer translator is a single-sided edge-extended wafer translator. More particularly, a support structure 702 is provided, and a single-sided edge-extended wafer translator 706 and a wafer 704 in the attached state are disposed on support structure 702 such that the back-side of wafer 704 is upon support structure 702. An inquiry system interface 708 is provided that is adapted to make electrical contact with the test pad arrays, which are disposed in an annular region located near the periphery of the wafer-side of wafer translator 706 that is not covered by the attached wafer. In some embodiments, support structure 702 remains stationary while inquiry system interface 708 moves into engagement with the test pad arrays of wafer translator 706. In other embodiments, inquiry system interface 708 remains stationary while support structure 702 moves toward inquiry system interface 708 thereby carrying wafer translator 706 into engagement with inquiry system interface 708. In a first contact arrangement, illustrated at 710, contact structures extend from inquiry system interface 708 towards the test pad arrays of single-sided edge-extended wafer translator 706. In an alternative contact arrangement, illustrated at 712, contact structures extend from wafer translator 706 towards inquiry system interface 708. It is noted that any suitable contact structures may be used, and the present invention is not limited to pins, pogo pins, micro-springs, contact pads, stud bumps, or similar structures. In some embodiments, pins are brazed onto corresponding pads of the test pad arrays and the inquiry system interface provides a socket that engages with those pins. Such a socket may be a zero insertion force (ZIF) type of socket.

Figure 8:
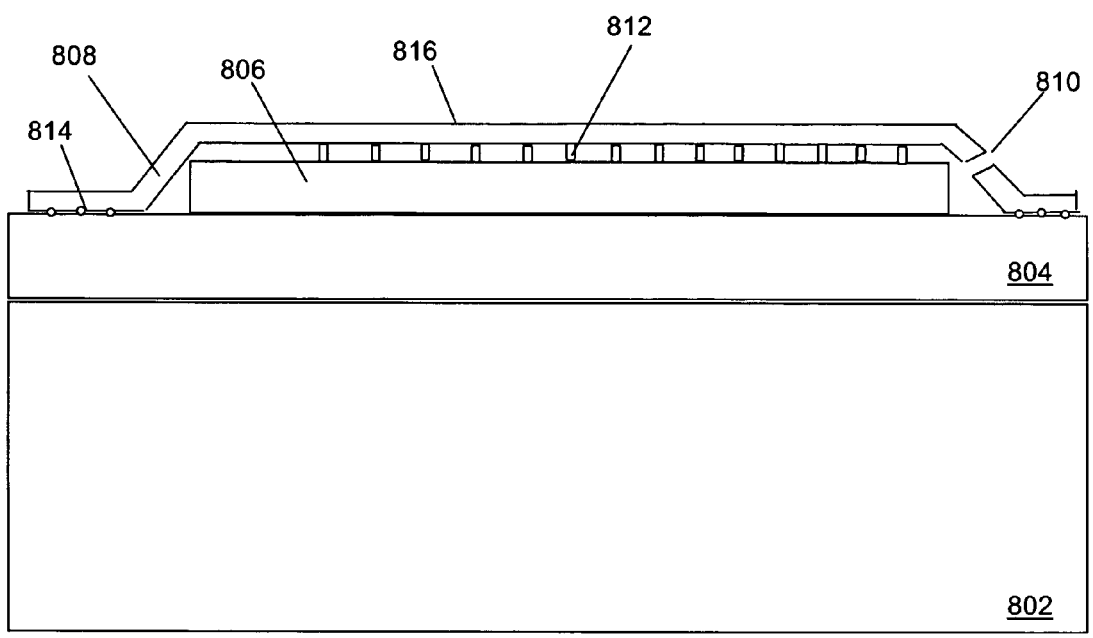
FIG. 8 is a cross-sectional view of wafer/wafer translator pair in the attached state, where the wafer translator is a flexible single-sided edge-extended wafer translator, the back-side of the wafer is disposed on a tester main board, and the extended edges of the single-sided wafer translator are further removably attached to the tester main board for electrical coupling with the tester pin electronics.

FIG. 8 shows an illustrative embodiment of the present invention in which a wafer/wafer translator pair is in the attached state, the wafer translator is a flexible single-sided edge-extended wafer translator, the back-side of the wafer is disposed on a tester main board, and the extended edges of the single-sided wafer translator are further removably attached to the tester main board for electrical coupling with the tester pin electronics. More particularly, tester pin electronics 802 are provided and signal paths are coupled between tester pin electronics 802 and a tester main board 804. A wafer 806, with one or more unsingulated integrated circuits thereon, is disposed on tester main board 804. A central portion of a single-sided edge-extended wafer translator 808 is disposed on wafer 806 and a peripheral portion of single-sided edge extended wafer translator 808 is disposed on tester main board 804. Single-sided edge-extended wafer translator 808 is removably attached to wafer 806 and tester main board 804. Removable attachment may be achieved by means of vacuum, or pressure differential attachment. In such an attachment process, the gas or gases between single-sided edge-extended wafer translator 808 and wafer 806 and tester main board 804 are at least partially removed through, for example, evacuation pathway 810. First contact structures 812 are disposed on single-sided edge-extended wafer translator 808 and are arranged in a pattern such that they make contact with the pads of the integrated circuits of wafer 804. In one embodiment of the present invention, first contact structures 812 are stud bumps. Second contact structures 814 provide electrical connections between tester main board 804 and single-sided edge-extended wafer translator 808 so that signals and/or power may be communicated between tester pin electronics 802 and the integrated circuits of wafer 806. It is noted that electrically conductive pathways are disposed on and/or in single-sided edge-extended wafer translator 808 to connect each of first contact structures 812 with corresponding ones of second structures 814. In various embodiments of the present invention, none of first contact structures 812, second contact structures 814, or the electrically conductive pathways that connect them are disposed on the non-wafer-side surface 816 of single-sided edge-extended wafer translator 808.

In an alternative embodiment to that shown in FIG. 8, there may be two or more evacuation pathways in single-sided edge-extended wafer translator 808. In this arrangement, at least one evacuation pathway is located in a central portion of single-sided edge-extended wafer translator 808, and at least one evacuation pathway is located in a peripheral portion of single-sided edge-extended wafer translator 808. Given this physical arrangement of evacuation pathways, removable attachment may be achieved as a multi-step process. By way of example, and not limitation, the central portion of single-sided edge-extended wafer translator 808 may be removably attached to wafer 806, and, at a prior or subsequent time, the peripheral portion may be removably attached to tester main board 804.

In one illustrative embodiment of the present invention, a single-sided edge-extended wafer translator provides electrical pathways between one or more unsingulated integrated circuits on a wafer and one or more test circuits external to the integrated circuits, and includes a flexible substrate having a first major surface and a second major surface; a plurality of first contact structures disposed in a central portion of the first surface of the flexible substrate; a plurality of second contact structures disposed in a peripheral annular region of the first surface of the flexible substrate; and a plurality of first electrically conductive pathways, each of the plurality of first electrically conductive pathways coupled to a respective first and second contact structure; wherein the second surface is free from first contact structures, second contact structures, and first electrically conductive pathways.

One illustrative method of providing access to a plurality of unsingulated integrated circuits on a wafer in accordance with the present invention, includes providing a first support structure, the first support structure having a first major surface and a second major surface; the first major surface thereof adapted to receive a wafer, and the second major surface thereof adapted to couple to tester pin electronics external to the integrated circuits; disposing a wafer on the first major surface of the first support structure; disposing a central portion of a removably attachable, single-sided edge-extended wafer translator over the wafer, and a peripheral portion of the removably attachable, single-sided edge-extended wafer translator on the first surface of the first support structure; and evacuating one or more gases from between the central portion of the removably attachable, single-sided edge-extended wafer translator and the wafer.

CONCLUSION

The exemplary methods and apparatus illustrated and described herein find application in the field of integrated circuit test and analysis.

An advantage of some embodiments of the present invention is that the pads on the wafer and the contact terminals of the tester contact the same side of a wafer translator.

It is to be understood that the present invention is not limited to the embodiments described above, but encompasses any and all embodiments within the scope of the subjoined Claims and their equivalents.

What is claimed is:

1. An assembly, comprising:
   a) a tester main board, having a first major surface and a second major surface;
   b) a wafer disposed on the first major surface of the tester main board;
   c) tester pin electronics, coupled to at least the second surface of the tester main board and providing a plurality of test circuits external to a plurality of unsingulated integrated circuits on the wafer; and
   d) a removably attachable single-sided edge-extended wafer translator for providing electrical pathways between one or more unsingulated integrated circuits and one or more test circuits external to the integrated circuits, the removably attachable single-sided edge-extended wafer translator comprising:
      a flexible substrate having a first major surface and a second major surface;
      a plurality of first contact structures disposed in a central portion of the first surface of the flexible substrate;
      a plurality of second contact structures disposed in a peripheral annular region of the first surface of the flexible substrate; and
      a plurality of first electrically conductive pathways, each of the plurality of first electrically conductive pathways coupled to a respective first and second contact structure;
         wherein a central portion of the first major surface of the flexible substrate is disposed superjacent the wafer, and a peripheral portion of the first major surface of the flexible substrate is disposed superjacent the tester main board;
         wherein the second surface of the flexible substrate is free from first contact structures, second contact structures, and first electrically conductive pathways.

2. The assembly of claim 1, further comprising at least one evacuation pathway through the flexible substrate.

3. The assembly of claim 1, wherein the first contact structures and the second contact structures are different.

4. The assembly of claim 1, wherein the second contact structures are grouped in spaced apart arrays.

5. The assembly of claim 1, wherein the flexible substrate comprises an organic material.

6. The assembly of claim 1, wherein a gasket is disposed between the wafer and the first surface of the removably attachable single-sided edge-extended wafer translator.

7. The assembly of claim 1, wherein the plurality of first contact structures are stud bumps.

8. The assembly of claim 1, wherein the central portion of the first major surface of the flexible substrate is removably attached to the wafer.

9. The assembly of claim 1, wherein the peripheral portion of the first major surface of the flexible substrate is removably attached to the tester main board.

10. The assembly of claim 1, wherein the central portion of the first major surface of the flexible substrate is removably attached to the wafer; and wherein the peripheral portion of the first major surface of the flexible substrate is removably attached to the tester main board.

* * * * *